(12) United States Patent
Huang

(10) Patent No.: US 8,094,102 B2
(45) Date of Patent: Jan. 10, 2012

(54) SINGLE FULL-COLOR LED WITH DRIVING MECHANISM

(75) Inventor: Hsien-Jung Huang, Taipei Hsien (TW)

(73) Assignee: APA Electronic Co.,Ltd., Taipei Hsien (TW)

( * ) Notice: Subject to any disclaimer, the term of this patent is extended or adjusted under 35 U.S.C. 154(b) by 559 days.

(21) Appl. No.: 12/355,785

(22) Filed: Jan. 18, 2009

(65) Prior Publication Data

US 2010/0182225 A1    Jul. 22, 2010

(51) Int. Cl.
G09G 3/32 (2006.01)
(52) U.S. Cl. .............. 345/83; 345/89; 345/102
(58) Field of Classification Search .......... None
See application file for complete search history.

(56) References Cited

U.S. PATENT DOCUMENTS

| 7,286,259 B2 * | 10/2007 | Ohno et al. ............ 345/82 |
| 7,825,877 B2 * | 11/2010 | Yoshida ................. 345/75.2 |
| 2007/0171180 A1 * | 7/2007 | Akiyama ............... 345/102 |

* cited by examiner

Primary Examiner — Muhammad N Edun (57) ABSTRACT

A package structure of full-color LED (Light Emitting Diode) with driving mechanism includes an IC (Integrated Circuit) chip, a red LED dice, a green LED dice, a blue LED dice, and corresponding current limiting resistors. The IC chip has a driving mechanism to control the red LED dice, the green LED dice, and the blue LED dice. By the specific arrangement of these internal elements, the package structure generates full-color light with high resolution, compact structure and high mixing uniformity, and also achieves low cost and decreases usage of space.

9 Claims, 6 Drawing Sheets

SINGLE FULL-COLOR LED WITH DRIVING MECHANISM

BACKGROUND OF THE INVENTION

1. Field of the Invention

The present invention relates to a package structure of full-color LED (Light Emitting Diode) adapted to various LED displays with special light-shadow effects, and more particularly, to a package structure of full-color LED equipped with internal driving mechanism.

2. Related Art

Light plays a significant role for a very long time in human life. Accompanying with the constant progresses of science and technology, LED (Light Emitting Diode) has been invented in 1970s. With the advantages of compact size, long lifetime, low breakage, low power consumption, no heat radiation and no toxic pollution (such as mercury and etc.), comparing with conventional light sources, LED is now broadly utilized in our daily life.

Figure 1:
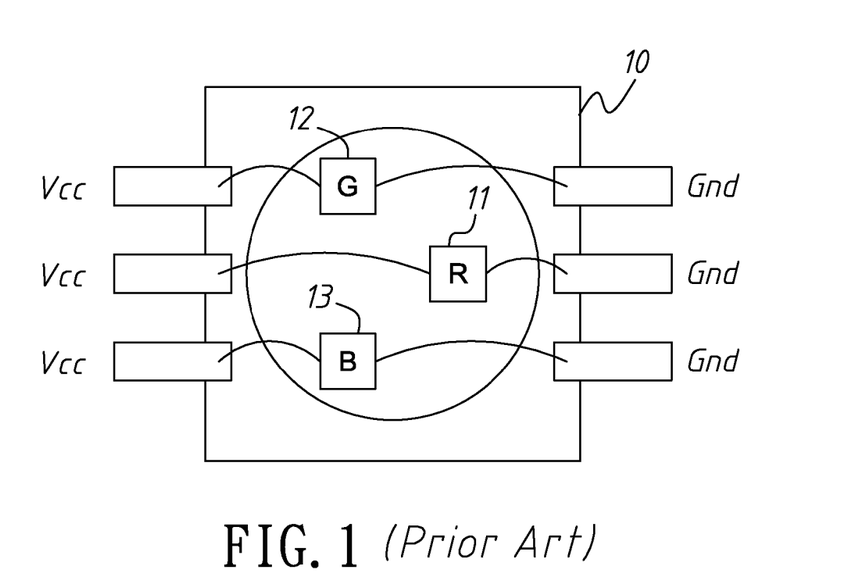
FIG. 1 is a schematic view for a package structure of a conventional full-color LED.

Through the environment/economization policies driven by the governments around the world, LED is well-developed and applied to two major applications including display and illumination functions. Due to plenty of nonstop technology advancements, the conventional single-color LED is gradually unable to satisfy human's visual needs. Consequently, advanced LED products such as bicolor LED and full-color LED are developed afterwards. FIG. 1 illustrates a schematic view for a package structure of a conventional full-color LED.

To display every color perfectly, the package structure 10 of the conventional full-color LED at least includes a red LED dice 11, a green LED dice 12 and a blue LED dice 13 configured therein, so that the tree primary color lights, red, green and blue lights may be used to mix and generate various colors of light. However, every color light needs different mixing ratio of the tree primary color lights so the full-color LED 10 needs to collocate with externally connected current limiting resistor(s) and driving element(s) and control the mixing ratio of the tree red, green and blue primary color lights.

Figure 2:
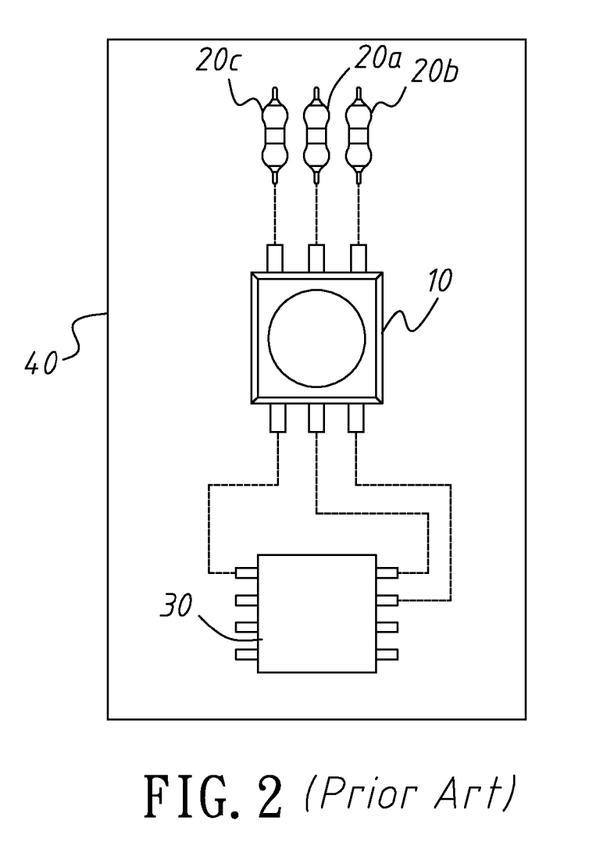
FIG. 2 is a schematic view for a practical structure of a conventional full-color LED.

In the prior art, the full-color LED 10, current limiting resistors 20a~20c and a driving element 30 is disposed on a printed circuit board (PCB) 40, as shown in FIG. 2, a schematic view for a practical structure of a conventional full-color LED. While multiple PCBs 40 are electrically connected with each other, plus using an operation power and control signals provided by a host to drive the full-color LED, a complete LED display screen is thus integrated by multiple well-arranged full-color LEDs.

SUMMARY OF THE INVENTION

To solve the aforesaid problems of the prior art, the present invention provides an electronic device equipped with an interactive display screen, and a processing method for interactive displaying. The present invention automatically controls and switches between a digitizer board and a touch panel, thereby saves the cost of an external hardware switch button and prevents the digitizer board and the touch panel from generating different input signals corresponding to the same touch behavior.

The technologies for the LED display screen integrated by full-color LEDs are almost fully developed. However, the LED display screen is unable to display fine images due to the overlarge interval between the adjacent full-color LEDs, where the overlarge interval results from configuring the current limiting resistors and the driving element on the PCB, together with the full-color LEDs. Meanwhile, circuit malfunction/failure also results from bad contacts generated between soldering pads of a bended flexible circuit board and the components disposed thereon. The exposed driving element is also easily to be affected by radio frequency interference (RFI) and electromagnetic interference (EMI), thereby affects the operations of the whole LED display screen.

Accordingly, the present invention discloses a package structure of a full-color LED that is equipped with driving mechanism. One aspect is to effectively improve the over-large intervals between the adjacent full-color LEDs in the conventional LED display screen. The package structure of the full-color LED in the present invention includes an IC (Integrated Circuit) chip, a red LED dice, a green LED dice and a blue LED dice configured together with current limiting resistors. In the IC chip, driving mechanism is equipped therein to control the red, green and blue LED dices. Through optimized arrangements and allocations for the internal components, a full-color LED is provided with a compact structure, high mixing uniformity and high resolution, and also achieves low cost and decreases usage of space.

On the other hand, packaging the IC chip into the full-color LED may further reduce radio frequency interference (RFI) and electromagnetic interference (EMI). Furthermore, the flexible circuit board may be omitted since the components are simplified; the present invention completely improves the problems of bad contacts between soldering pads of a bended flexible circuit board and the components disposed thereon. Besides, when the intervals between adjacent full-color LEDs are lessened, the overall power consumption of the LED display screen is reduced, thereby facilitate the effects of easy control and power economization.

These and other features, aspects, and advantages of the present invention will become better understood with reference to the following description and appended claims. It is to be understood that both the foregoing general description and the following detailed description are examples, and are intended to provide further explanation of the invention as claimed.

BRIEF DESCRIPTION OF THE DRAWINGS

The present invention will become more fully understood from the detailed description given herein below for illustration only, and thus is not limitative of the present invention, and wherein.

DETAILED DESCRIPTION OF THE INVENTION

Reference will now be made in detail to the present preferred embodiments of the invention, examples of which are illustrated in the accompanying drawings. Wherever possible, the same reference numbers are used in the drawings and the description refers to the same or the like parts.

Figure 3A:
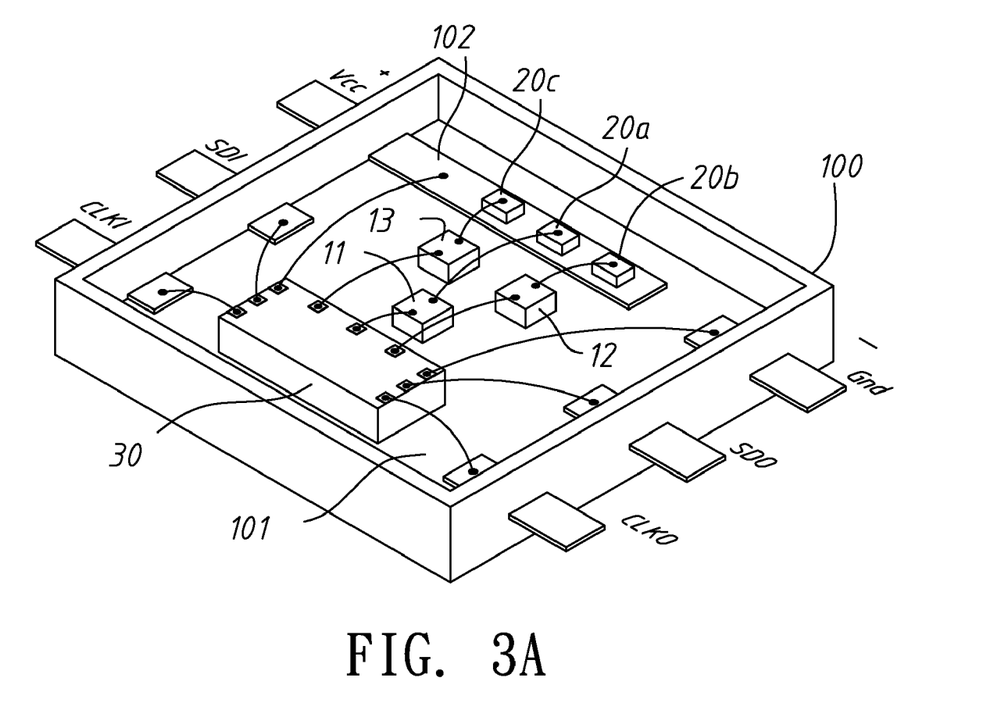
FIG. 3A is a schematic view of a first embodiment according to the present invention, illustrating a package structure of a full-color LED equipped with driving mechanism.

Please refer to FIG. 3A, which is a schematic view of a first embodiment according to the present invention, illustrating a package structure of a full-color LED equipped with driving mechanism.

The package structure of the full-color LED equipped with driving mechanism has six pins, including a power input Vcc, a power output Gnd, a clock input CLKI, a clock output CLKO, a serial data input SDI and a serial data output SDO. The package structure allocated inside a frame 100 includes an IC (Integrated Circuit) chip 30, three current limiting resistors 20a, 20b, 20c, a red LED dice 11, a green LED dice 12 and a blue LED dice 13. Each of the three red, green and blue LED dices 11-13 has a first electrode and a second electrode respectively configured thereon; all the three red, green and blue LED dices 11-13 are fixed on a carrier 101.

The power input Vcc extends into the package structure of the full-color LED 10 to form a rectangular extension section 102. On the extension section 102, there are three current limiting resistors 20a~20c pasted thereon. The current limiting resistors 20a~20c are the chip resistors with two electro-conductive surfaces. Therefore, when the bottoms of the current limiting resistors 20a~20c are pasted on the extension section 102, the current limiting resistors 20a~20c form electrical connections with the power input Vcc directly. On the tops of the current limiting resistors 20a~20c, metal wirings are used for wire bonding to the first electrodes of the blue, red and green LED dices 13, 11, and 12.

Figure 3B:
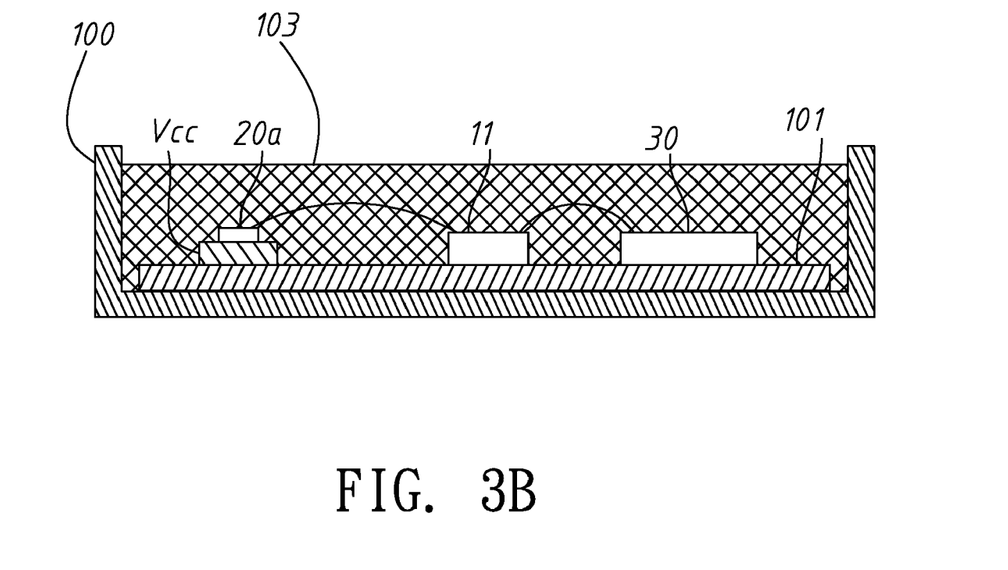
FIG. 3B is a lateral cross-sectional view of the first embodiment according to the present invention.

The second electrodes of the red, green and blue LED dice 11-13 connect to control points of the IC chip 30 through wire bonding. The IC chip 30 is pasted on the carrier 101, and is connected by wire bonding with the six pins including the power input Vcc, the power output Gnd, the clock input CLKI, the clock output CLKO, the serial data input SDI and the serial data output SDO. Eventually, feed in light-mixing glue 103 of light-pervious material to complete the package. For the corresponding positions of said components, please refer to FIG. 3B, which is a lateral cross-sectional view of the first embodiment according to the present invention.

Figure 4:
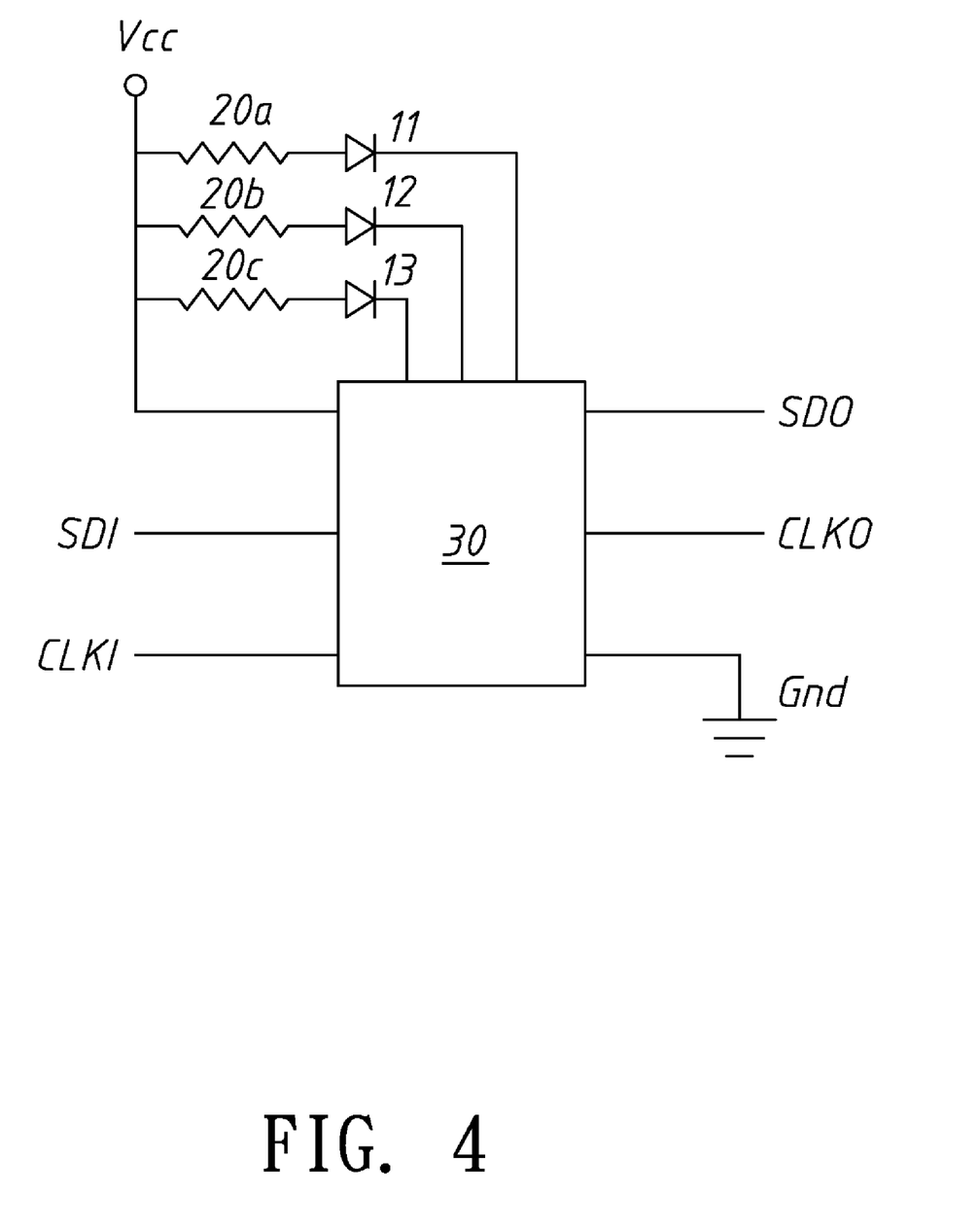
FIG. 4 shows a equivalent electrical circuit for the full-color LED equipped with driving mechanism according to the present invention.

Please refer to FIG. 4, which shows a equivalent electrical circuit for the full-color LED equipped with driving mechanism according to the present invention. First of all, the operation power is input from the power input Vcc and sent to the IC chip 30. Then the operation power is provided to the red, green and blue LED dices 11-13 through the three current limiting resistors 20a~20c in parallel. The current limiting resistors 20a~20c are used to precisely distribute the operation power in to the three LED dices, thereby ensure the light colors generated by mixing lights of the LED dices and also to form protections for the LED dices. Through the clock input CLKI and the serial data input SDI, control signals are sent to the IC chip 30; afterwards, the driving mechanism of the IC chip 30 generates various voltage controls on the red, green and blue LED dices 11-13 to mix for different light colors. The operation power is sent through the power output GND; the control signals are sent to a next full-color LED through the clock output CLKO and serial data output SDO.

Without against the uniform inventive concepts, the present invention further has another practical embodiment. Please refer to FIG. 5A, which is a schematic view of a second embodiment according to the present invention, illustrating another package structure of the full-color LED equipped with driving mechanism.

Figure 5A:
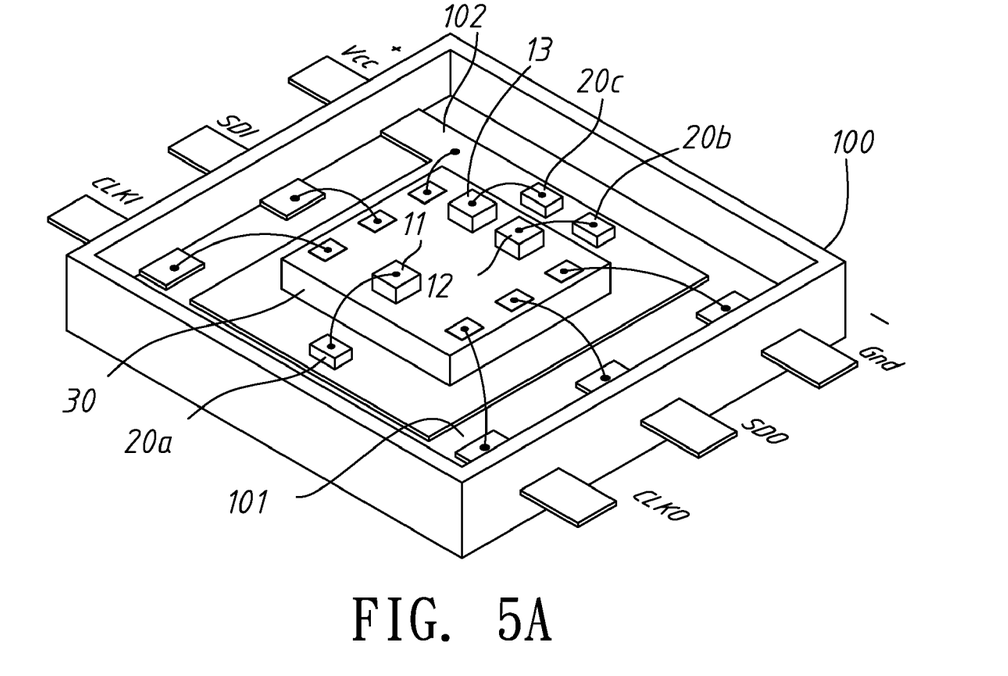
FIG. 5A is a schematic view of a second embodiment according to the present invention, illustrating another package structure of the full-color LED equipped with driving mechanism.

In this embodiment of the package structure of the full-color LED equipped with driving mechanism, the package structure of the full-color LED has similarly six pins, including a power input VCC, a power output GND, a clock input CLKI, a clock output CLKO, a serial data input SDI and a serial data output SDO. The feature is that the power input Vcc extends into the frame 100 to form a rectangular planar extension section 102 on carrier 101. The IC chip 30 is directly pasted on the extension section 102 and connects through wire bonding with the six pins, the power input Vcc, the power output Gnd, the clock input CLKI, the clock output CLKO, the serial data input SDI and the serial data output SDO.

Each of the red, green and blue LED dices 11-13 is configured respectively with a first electrode and a second electrode. In the present embodiment, the red, green and blue LED dices 11-13 are fixed on the control points of the IC chip 30 and form electrical connections with the control points by means of joint-chip or direct paste.

Figure 5B:
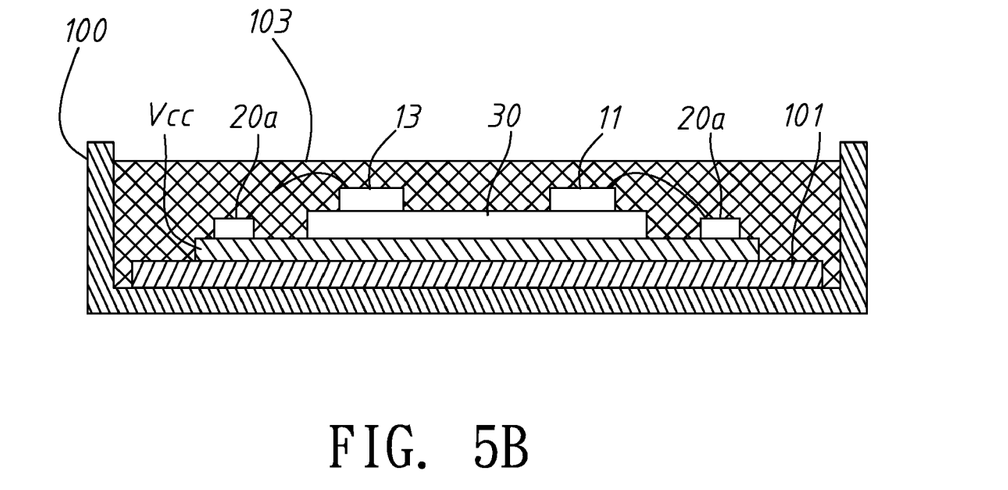
FIG. 5B is a lateral cross-sectional view of the second embodiment according to the present invention.

The three current limiting resistors 20a~20c are pasted on optimal positions of the extension section 102. Such current limiting resistors are all chip resistors with two electro-conductive surfaces. Therefore, when the bottoms of the current limiting resistors 20a~20c are pasted on the extension section 102, the current limiting resistors 20a~20c form electrical connections with the power input Vcc directly. On the tops of the current limiting resistors 20a~20c, metal wirings are used for wire bonding to the first electrodes of the blue, red and green LED dices 13, 11, and 12. After all the electrical connections are completed, feed in light-mixing glue 103 of light-pervious material to complete the package. Refer to FIG. 5B to review the stacked status; FIG. 5B is a lateral cross-sectional view of the second embodiment according to the present invention. From the drawing, it is obvious that in the second embodiment, the amount of 'wire bonding' is reduced. Meanwhile, the three primary color dices are configured together on the IC chip, thereby facilitate shorten light-mixing distances and more complete light colors.

Aside from the aforesaid embodiment, the present invention further discloses another practical embodiment. Please refer to FIG. 6A, which is a schematic view of a third embodiment according to the present invention, illustrating another package structure of the full-color LED equipped with driving mechanism.

Figure 6A:
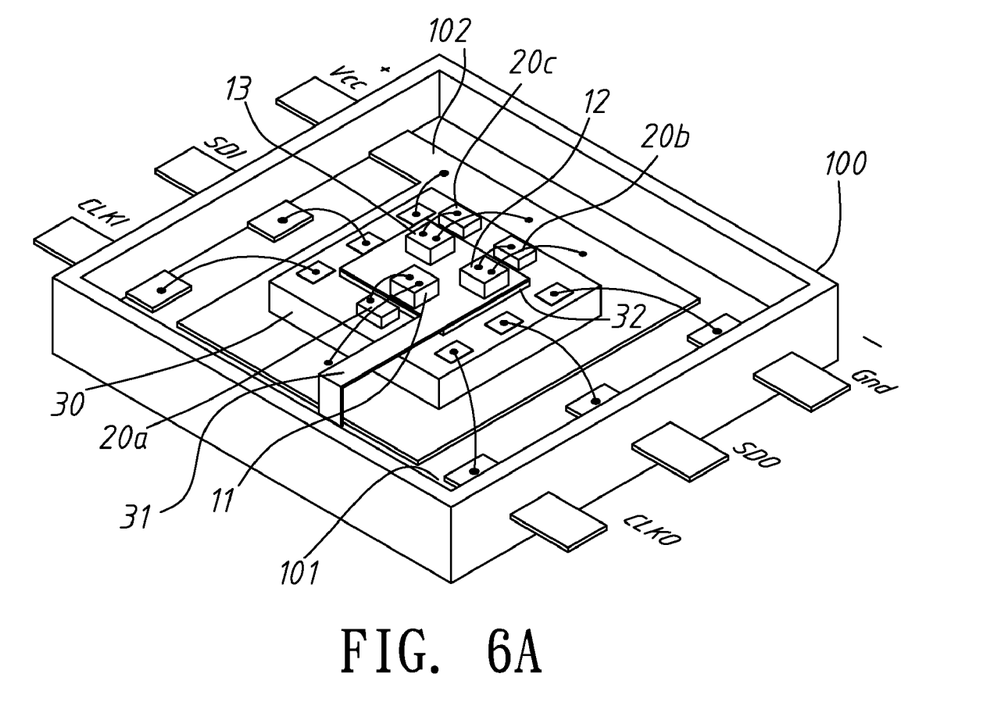
FIG. 6A is a schematic view of a third embodiment according to the present invention, illustrating another package structure of the full-color LED equipped with driving mechanism.

In the package structure of this embodiment, the full-color LED has similar six pins, including a power input Vcc, a power output Gnd, a clock input CLKI, a clock output CLKO, a serial data input SDI and a serial data output SDO. The power input Vcc may still extend into the frame 100 and form a rectangular planar extension section 102 on the carrier 101. The IC chip 30 is still directly pasted on the extension section 102, and is connected through wire bonding with the power input Vcc, the power output Gnd, the clock input CLKI, the clock output CLKO, the serial data input SDI and the serial data output SDO.

Each of the red, green and blue LED dices 11-13 is respectively configured with a first electrode and a second electrode. To avoid the normal operation of the IC chip 30 due to the heat produced by the LED dices 11-13 during illuminating, a heat isolating layer 13 is pasted on the IC chip 30. The heat isolating layer 32 is made of glass or ceramic material to isolate the heat produced by the LED dices 11-13. Moreover, a heat conducting layer 31 is pasted on the heat isolating layer 32 and connected to the carrier 101 or the inner frame. The heat produced by the LED dices 11-13 is transmitted out of the package structure through the heat conducting layer 31. The heat conducting layer 31 is made of materials with high heat transfer coefficient, such as metal or alloy. The red, green and blue LED dices 11-13 is respectively pasted on optimal positions of the heat conducting layer 31. The first electrode and the extension section 102 forms electrical connections through wire bonding.

Figure 6B:
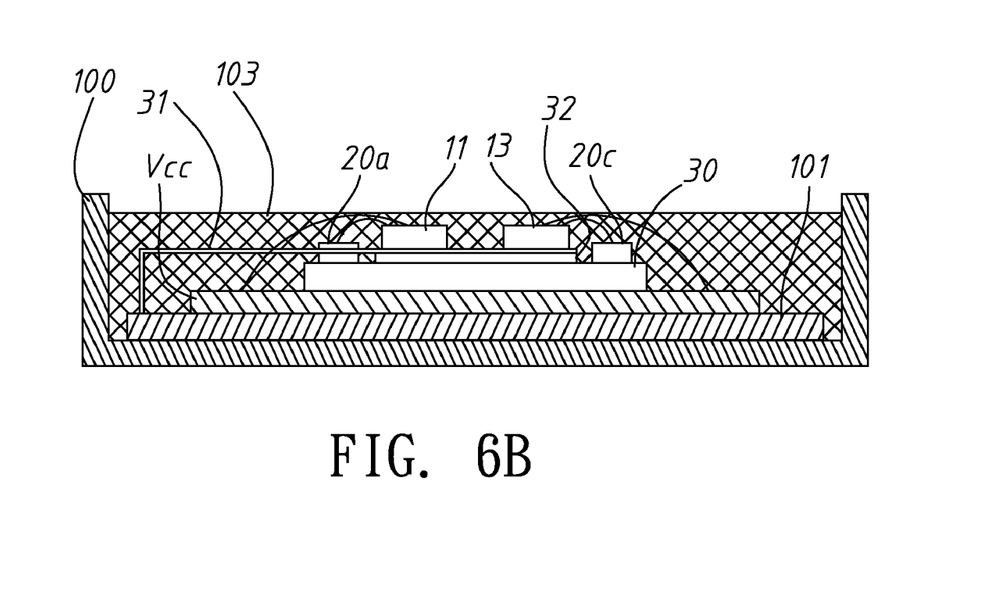
FIG. 6B is a lateral cross-sectional view of the third embodiment according to the present invention.

The three current limiting resistors 20a~20c are pasted on the control points of the IC chip 30. Such current limiting resistors are all chip resistors with two electro-conductive surfaces. Therefore when the bottoms of the current limiting resistors 20a~20c are pasted on the control points of the IC chip 30, the current limiting resistors 20a~20c directly form electrical connections. On the tops of the current limiting resistors 20a~20c, metal wirings are used for wire bonding to the second electrodes of the blue, red and green LED dice 13,11,12 on the IC chip 30. Afterwards, feed in light-mixing glue 103 of light-pervious material to complete the package. Refer to FIG. 6B to review the stacked status; FIG. 6B is a lateral cross-sectional view of the third embodiment according to the present invention. From the drawings, the third embodiment is obviously similar to the second embodiment. Although the current limiting resistors 20a~20c and the blue, red and green LED dices 13,11,12 exchange connection relationships with each other, the functions are not affected. Therefore this embodiment has the same advantages of the second embodiment. Meanwhile the third embodiment will dispose current limiting resistors 20a~20c on the IC chip 30, so as to shorten the intervals between full-color LEDs, at the same time the blue, red and green LED dice 13, 11,12 have closer positions to achieve a better light-mixing effects.

Figure 7:
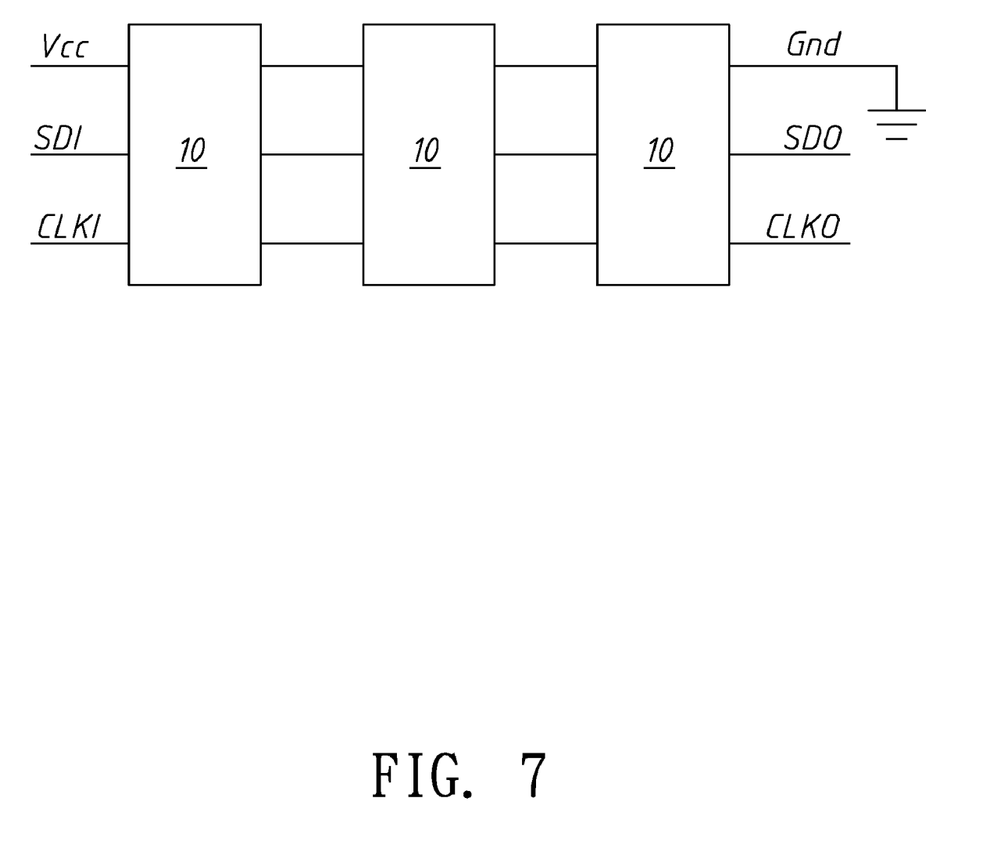
FIG. 7 shows a schematic view for a display screen of the full-color LED equipped with driving mechanism according to the present invention.

In the end, please refer to FIG. 7, which shows a schematic view for a display screen of the full-color LED equipped with driving mechanism according to the present invention.

Through connecting the full-color LED 10 disclosed the present invention, a large LED display screen may be integrated and formed; wherein each of the full-color LED 10 connects with another through cascade control. The control signals may be output through a large control end. In the control signals, there are clock (CLK) data for all the full-color LEDs 10 to operate in synchronization, serial data (SD) for controlling the red, green and blue LED dices. After the full-color LED 10 receives control signals from the clock input CLKI and the serial data input SDI, PWM (Pulse Width Modulation) may be used to control the light-color mixing of the red, green and blue LED dices. The control signals may be sent to another full-color LED 10 through the clock input CLKO and the serial data input SDO. By means of said method, a designer many connect a large amount of full-color LEDs to form a large-scale LED display screen. Since the full-color LED has an IC chip and current limiting resistors, the intervals between the adjacent full-color LEDs so that the distance in-between is effectively shortened and a large-scale display screen may display finer images.

Additional advantages and modifications will readily occur to those proficient in the relevant fields. The invention in its broader aspects is therefore not limited to the specific details and representative embodiments shown and described herein. Accordingly, various modifications may be made without departing from the spirit or scope of the general inventive concept as defined by the appended claims and their equivalents.

What is claimed is:

1. A package structure of full-color LED (Light Emitting Diode), comprising:
    a power input, a power output, a clock input, a clock output, a serial data input and a serial data output, wherein the power input has an extension section;
    a carrier having an inner space to dispose a red LED dice, a green LED dice and a blue LED dice, each of the red, green and blue LED dices being respectively configured with a first electrode and a second electrode thereon;
    a first current limiting resistor, being pasted on the extension section of the power input to form electrical connection, and connecting with the first electrode of the blue LED dice through metal wiring;
    a second current limiting resistor, being pasted on the extension section of the power input to form electrical connection, and connecting with the first electrode of the red LED dice through metal wiring;
    a third current limiting resistor, being pasted on the extension section of the power input to form electrical connection, and connecting with the first electrode of the green LED dice through metal wiring; and
    an IC (Integrated Circuit) chip, being pasted on the carrier and respectively connecting with the second electrode of each of the red, green and blue LED dices through metal wiring, the IC chip controlling the red, green and blue LED dices after receiving an operation power from the power input and receiving a control signal from the clock input and the serial data input, the IC chip further sending out the operation power through the power output and also sending out the control signal through the clock output and the serial data output.

2. The package structure of claim 1, wherein the first current limiting resistor, the second current limiting resistor and the third current limiting resistor are chip resistors with two electro-conductive surfaces.

3. The package structure of claim 1, wherein the red, green and blue LED dices are controlled through a PWM (Pulse Width Modulation).

4. A package structure of full-color LED (Light Emitting Diode), comprising:
    a power input, extending to form an extension section, a power output, a clock input, a clock output, a serial data input and a serial data output;
    a IC (Integrated Circuit) chip, being pasted on the extension section, the IC chip having a red LED dice, a green LED dice and a blue LED dice pasted thereon, each of the red, green and blue LED dices being respectively configured with a first electrode and a second electrode thereon, the IC chip electrically connecting with the second electrode of each of the red, green and blue LED dices respectively, the IC chip controlling the red, green and blue LED dices after receiving an operation power from the power input and receiving a control signal from the clock input and the serial data input, the IC chip further sending out the operation power through the power output and also sending out the control signal through the clock output and the serial data output;
    a first current limiting resistor, being pasted on the extension section of the power input to form electrical connection, and connecting with the first electrode of the blue LED dice through metal wiring;

a second current limiting resistor, being pasted on the extension section of the power input to form electrical connection, and connecting with the first electrode of the red LED dice through metal wiring; and a third current limiting resistor, being pasted on the extension section of the power input to form electrical connection, and connecting with the first electrode of the green LED dice through metal wiring.

5. The package structure of claim 4, wherein the first current limiting resistor, the second current limiting resistor and the third current limiting resistor are chip resistors with two electro-conductive surfaces.

6. The package structure of claim 4, wherein the red, green and blue LED dices are controlled through PWM (Pulse Width Modulation).

7. A package structure of full-color LED (Light Emitting Diode), comprising:

a power input, extending to form an extension section, a power output, a clock input, a clock output, a serial data input and a serial data output;

a IC (Integrated Circuit) chip, being pasted on the extension section, comprising:

a heat isolating layer, pasted on the IC chip;

a heat conducting layer, pasted on the heat isolating layer;

a red LED dice, a green LED dice and a blue LED dice pasted on the heat conducting layer, each of the red, green and blue LED dices being respectively configured with a first electrode and a second electrode thereon, the first electrode of the red, green and blue LED dices electrically connecting with the power input through metal wiring, the IC chip controlling the red, green and blue LED dices after receiving an operation power from the power input and receiving a control signal from the clock input and the serial data input, the IC chip further sending out the operation power through the power output and also sending out the control signal through the clock output and the serial data output;

a first current limiting resistor, being pasted on the IC chip to form electrical connection, and connecting with the second electrode of the blue LED dice through metal wiring;

a second current limiting resistor, being pasted on the IC chip to form electrical connection, and connecting with the second electrode of the red LED dice through metal wiring; and a third current limiting resistor, being pasted on the IC chip to form electrical connection, and connecting with the second electrode of the green LED dice through metal wiring.

8. The package structure of claim 7, wherein the first current limiting resistor, the second current limiting resistor and the third current limiting resistor are chip resistors with two electro-conductive surfaces.

9. The package structure of claim 7, wherein the red, green and blue LED dices are controlled through PWM (Pulse Width Modulation).

* * * * *